United States Patent
Cho et al.

(10) Patent No.: US 7,063,997 B2
(45) Date of Patent: Jun. 20, 2006

(54) PROCESS FOR PRODUCING NITRIDE SEMICONDUCTOR LIGHT-EMITTING DEVICE

(75) Inventors: Dong Hyun Cho, Daegu (KR); Masayoshi Koike, Kyungki-do (KR); Hun Joo Hahm, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/893,924

(22) Filed: Jul. 20, 2004

(65) Prior Publication Data
US 2005/0221526 A1 Oct. 6, 2005

(30) Foreign Application Priority Data
Mar. 31, 2004 (KR) ............ 10-2004-0022115

(51) Int. Cl.
*H01L 21/00* (2006.01)
(52) U.S. Cl. ............... 438/39; 438/46; 438/47
(58) Field of Classification Search ......... 438/37, 438/39, 46, 47

See application file for complete search history.

(56) References Cited

U.S. PATENT DOCUMENTS

| 5,563,422 | A | | 10/1996 | Nakamura et al. |
| 5,740,192 | A | * | 4/1998 | Hatano et al. ........... 372/45 |
| 5,834,331 | A | * | 11/1998 | Razeghi ................. 438/40 |
| 5,909,040 | A | * | 6/1999 | Ohba et al. ............ 257/190 |
| 6,111,275 | A | * | 8/2000 | Hata ..................... 257/97 |
| 6,172,382 | B1 | * | 1/2001 | Nagahama et al. ...... 257/94 |
| 6,232,137 | B1 | * | 5/2001 | Sugawara et al. ....... 438/46 |
| 6,413,312 | B1 | * | 7/2002 | Kawai et al. .......... 117/104 |

FOREIGN PATENT DOCUMENTS

| JP | 9-283793 | 10/1997 |
| KR | 2001-0088930 | 9/2001 |

* cited by examiner

*Primary Examiner*—Trung Dang
(74) *Attorney, Agent, or Firm*—Lowe Hauptman & Berner, LLP

(57) ABSTRACT

A process for producing a nitride semiconductor light-emitting device includes the steps of preparing a substrate, growing a p-type nitride semiconductor layer on the substrate by the MOCVD process using hydrazine-based gas as a nitrogen precursor and $N_2$ gas as a carrier gas, forming an active layer on the p-type nitride semiconductor layer, forming an n-type conductive nitride semiconductor layer on the active layer, and forming p- and n-electrodes in electrical connection with the p- and n-type nitride semiconductors, respectively.

18 Claims, 3 Drawing Sheets

PROCESS FOR PRODUCING NITRIDE SEMICONDUCTOR LIGHT-EMITTING DEVICE

RELATED APPLICATIONS

The present application is based on, and claims priority from, Republic of Korea Application Serial Number 2004-22115, filed Mar. 31, 2004, the disclosure of which is hereby incorporated by reference herein in its entirety.

BACKGROUND OF THE INVENTION

1. Field of the Invention

The present invention relates to a process for producing a nitride semiconductor light-emitting device, and more particularly to a process for producing a nitride semiconductor light-emitting device having a novel structure in which a transparent electrode layer for improving contact resistance on a p-electrode may be eliminated.

2. Description of the Related Art

A nitride semiconductor light-emitting device is a high output power optical device that produces short wavelength light such as blue, green light, or the like, thus enabling it to produce a variety of colors, and attracts a great deal of attention in the related technical art A constituent material of the nitride semiconductor light-emitting device is semiconductor single crystals of a composition formula $Al_xIn_yGa_{(1-x-y)}N$ ($0 \leq x,y,x+y \leq 1$) Nitride semiconductor single crystals may be grown on substrates such as sapphire or SiC by using crystal-growth methods such as MOCVD (Metal Organic Chemical Vapor Deposition), HVPE (Hydride Vapor Phase Epitaxy), and the like. These substrates for growth of nitride single crystals are electrically insulative, and thereby, electrodes cannot be mounted on the back surface of the substrate unlike conventional light-emitting devices. Thus both electrodes must be formed on a crystal-grown semiconductor layer. FIG. 1 shows the structure of a conventional GaN-based light-emitting device.

Referring to FIG. 1, the conventional nitride semiconductor light-emitting device; which is designated by reference number 20, includes a sapphire substrate 11, and an n-type nitride semiconductor 15, an active layer 16 and a p-type nitride semiconductor 17 formed sequentially thereon. Further, in order to improve a lattice matching of the n-type nitride semiconductor layer 15 with the sapphire substrate 11, a buffer layer (not shown) such as AlN, GaN or AlGaN may be formed prior to growing the n-type nitride semiconductor layer 15.

As discussed above, since the sapphire substrate 11 is electrically insulative, formation of both electrodes on the upper surface thereof may be achieved by etching the p-type nitride semiconductor layer 17 and the active layer 16, at a predetermined region, to expose a portion of the upper surface of the n-type nitride semiconductor layer 15 corresponding to the predetermined region, and forming an n-electrode 19a made of a Ti/Al layer on the upper exposed surface portion of the n-type nitride semiconductor layer 15.

However, the above-mentioned p-type nitride semiconductor layer 17 has a relatively high resistance, and so a layer capable of forming an ohmic contact with conventional electrodes is added thereto. Also, this layer needs to be formed of a highly light-transmissive material so as to prevent deterioration of light-emitting efficiency.

For this purpose, U.S. Pat. No. 5,563,422 (Applicant: Nichia Chemical Industries, Ltd, Japan, Issued on Oct. 8, 1996) proposes formation of a transparent electrode 18 made of Ni/Au to form an ohmic contact, prior to forming a p-electrode 19b on the p-type nitride semiconductor layer 17. The transparent electrode 18 may form an ohmic contact while increasing an application area of electric current, thereby lowering a forward voltage ($V_f$).

However, the transparent electrode 18 made of Ni/Au has a transmissivity of only about 60%, suffering from great loss of light due to absorption.

To overcome this low light-transmissivity problem, there had been proposed formation of a layer of ITO (Indium Tin Oxide), known as have a transmissivity of more than about 90%, in place of the Ni/Au layer. But, since the ITO has a weak adhesiveness to nitride crystals and also a work function of 4.7 to 5.2 eV, compared to 7.5 eV of a p-type GaN, direct vapor-deposition of ITO on the p-type GaN layer does not form an ohmic contact and thus an additional formation of a thin Zn- or C-doped Ni/Au layer is necessary.

Further, a complex process is required to add a layer for an ohmic contact of the above-mentioned transparent electrode layer. A heat treatment process is needed to form $NiO_2$ with a predetermined transmissivity after forming the Ni/Au layer, for instance, resulting in disadvantages of a complex process.

To resolve this problem, a method may be considered which includes forming an n-type nitride semiconductor layer having a relatively lower electrical resistance on the upper part of an active layer, and forming a p-type nitride semiconductor layer having a relatively higher electrical resistance between the active layer and a substrate. But, this method is not suitable for the p-type nitride semiconductor because of a heat treatment process required to activate p-type impurities.

SUMMARY OF THE INVENTION

Therefore, the present invention has been made in view of the above problems, and it is an object of the present invention to provide a process for producing a nitride semiconductor light-emitting device having an n-type nitride semiconductor layer arranged on a light-emitting side (generally, the side opposite the substrate) of an active layer by forming a p-type nitride semiconductor layer in such a manner that a heat treatment process to activate p-type impurities may be eliminated.

In accordance with the present invention, the above and other objects can be accomplished by the provision of a process for producing a nitride semiconductor light-emitting device comprising the steps of:

preparing a substrate, growing a p-type nitride semiconductor layer by the MOCVD process using hydrazine-based gas as a nitrogen precursor material and $N_2$ gas as a carrier gas, forming an active layer on the p-type nitride semiconductor layer, forming an n-type conductive nitride semiconductor layer on the active layer, and forming p- and n-electrodes in electrical connection with the p- and n-type nitride semiconductors, respectively.

Preferably, the p-type impurities used in the p-type nitride semiconductor layer may be Mg.

Preferably, the present process may further comprise forming a buffer layer on the substrate, prior to forming the p-type nitride semiconductor layer. This buffer layer may be a low temperature nucleus-growth layer made of material having the formula of $Al_xIn_yGa_{1-(x+y)}N$ ($0 \leq x, y \leq 1$).

The step of forming the p-type nitride semiconductor layer may comprise the steps of forming a first layer made of a p-type $Al_xIn_yGa_{1-(x+y)}N$ ($0 \leq x$, $y \leq 1$) material on the substrate, and forming on the first layer a second layer made of $Al_xIn_yGa_{1-(x+y)}N$ ($0 \leq x$, $y \leq 1$) material having an energy band gap greater than that of the first layer. In addition, in association with this step or separately, the step of forming the n-type nitride semiconductor layer may include the steps of forming the first layer made of an n-type $Al_xIn_yGa_{1-(x+y)}N$ ($0 \leq x$, $y \leq 1$) material on the active layer, and forming a second layer made of $Al_xIn_yGa_{1-(x+y)}N$ ($0 \leq x$, $y \leq 1$) material having an energy band gap smaller than that of the first layer thereon.

Preferably, the step of forming the n-type nitride semiconductor layer may comprise an additional forming of a high concentration n-type $Al_xIn_yGa_{1-(x+y)}N$ ($0 \leq x$, $y \leq 1$) layer on the n-type nitride semiconductor layer. In this case, contact resistance with the n-electrode may be further improved.

Preferably, the substrate as mentioned above is electrically insulative. The step of forming the p- and n-electrodes may comprise the steps of mesa etching the n-type nitride semiconductor layer and active layer to partially remove a portion of them so as to expose the region of the p-type nitride semiconductor layer, and forming the p- and n-electrodes on the exposed portion of the p-type nitride semiconductor layer and the n-type nitride semiconductor layer, respectively.

Substrates having an electrically insulative property may include those selected from the group consisting of sapphire, SiC, ZnO, GaN, GaAs and Si substrates. The p-electrode may include a Ni/Au layer. The n-electrode may include a Ti/Al layer.

Additionally, the process of the present invention may further comprise the step of forming a p-type contact layer on the substrate before the p-type nitride semiconductor layer is formed. As the p-type contact layer, a p-type ZnO layer or a p-type InGaN layer may be used. Preferably, the step of forming the p-electrode may be accomplished by mesa etching the p-type contact layer to expose a portion thereof, and forming the p-electrode on the region of the exposed portion of the p-type contact layer.

Preferably, the substrate may be a p-type conductive substrate. The step of forming the p- and n-electrodes may be accomplished by forming a p-electrode on the lower part of the p-type conductive substrate, and forming an n-electrode on the n-type nitride semiconductor layer. As an electrically conductive p-type substrate, those selected from the group consisting of GaAs, ZnO, GaN and Si substrates doped with p-type impurities may be used.

Further, the present invention includes a nitride semiconductor light-emitting device prepared by the method as mentioned above.

The present invention provides a method for producing a structure having an n-type nitride semiconductor layer disposed on a light-emitting side relative to an active layer, and a p-type nitride semiconductor layer disposed between a substrate and the active layer. In this structure, the n-type nitride semiconductor layer having a low electrical resistance is disposed on the light-emitting side. Thus, there is an advantage of eliminating the step of forming a layer for improving contact resistance such as a transparent electrode layer or ITO layer.

Further, the present invention provides a solution to a problem involved in placement of the p-type nitride semiconductor layer between the substrate and active layer. That is, the conventional process requires a high temperature heat treatment or UV-annealing process in order to activate p-type impurities in the p-type nitride semiconductor layer. However, it presents not only problems of stopping a continuous nitride semiconductor growth and necessitating an additional heat treatment, but also damages crystal faces in which the active layer will grow, due to a heat treatment, resulting in an insurmountable problem, making it impossible to obtain high quality crystals. In order to overcome these disadvantages, the present invention provides a method of growing the p-type nitride semiconductor layer in which a subsequent heat treatment may be eliminated.

The conventional subsequent heat treatment is a process for degrading Mg—H complexes to provide energy necessary for activating Mg impurities. This Mg—H complex is formed by $H_2$ used as a carrier gas, and $NH_3$ supplied as a nitrogen precursor gas. Therefore, the present invention uses a hydrazine-based nitrogen precursor to form highly reactive $NH_2$ radicals, and due to the low energy of their molecular bonds, may form a nitride semiconductor layer at lower temperature. In addition, the present invention uses $N_2$ as a carrier gas resulting in a minimal amount of $H_2$ producton, and thus may form the p-type nitride semiconductor layer containing activated p-type impurities without heat treatment.

As seen from the foregoing, the present invention provides a novel method for producing a structure having the n-type nitride semiconductor layer, and p-type nitride semiconductor layer disposed between the substrate and the active layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 2:
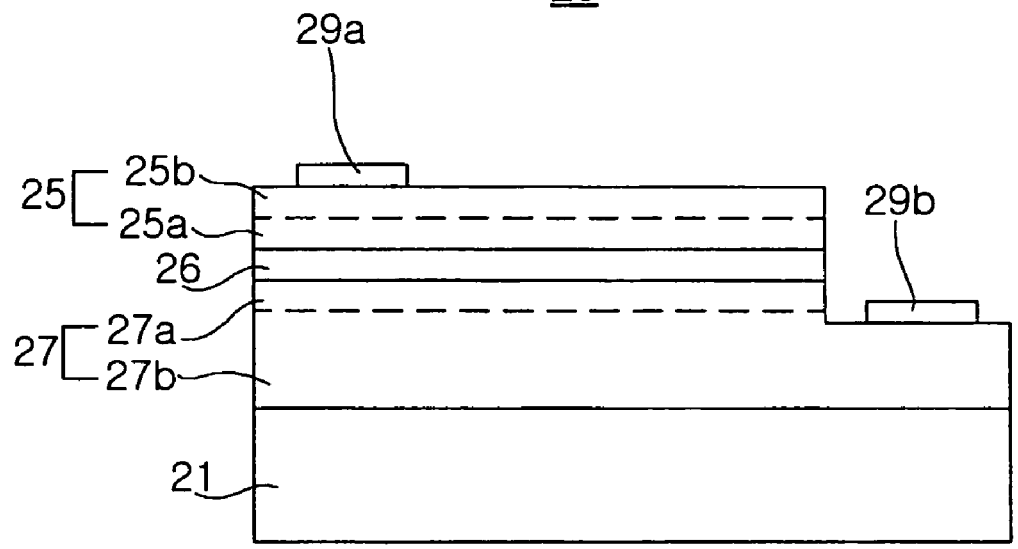
FIG. 2 is a cross-sectional side view of a nitride semiconductor light-emitting device according to one embodiment of the present invention.

Preferred embodiments of the present invention will now be described in detail with reference to the annexed drawings. FIG. 2 is a cross-sectional side view of a nitride semiconductor light-emitting device 20 according to one embodiment of the present invention.

As shown in FIG. 2, the nitride semiconductor light-emitting device 20 includes a sapphire substrate 21, and a p-type nitride semiconductor layer 27, an active layer 26 and an n-type nitride semiconductor layer 25, these layers being formed sequentially on the sapphire substrate 21. Further, in order to improve a lattice matching of the p-type nitride semiconductor layer 27 with the sapphire substrate 21, a buffer layer may be formed thereon prior to growth of the p-type nitride semiconductor layer 27. As the buffer layer, a low temperature nucleus-growth layer made of a formula $Al_xIn_yGa_{1-(x+y)}N$ ($0 \leq x, y \leq 1$) material may be used.

Referring now to FIG. 2, a process for producing the nitride semiconductor light-emitting device 20 will be described in detail.

First, the p-type nitride semiconductor layer 27 may include one or more layer made of a p-type $Al_xIn_yGa_{1-(x+y)}N$ ($0 \leq x, y \leq 1$) material. For instance, the p-type nitride semiconductor layer 27 can be formed by growing a p-type GaN layer 27b on the substrate 21, followed by growing a p-type $Al_xGa_{1-x}N$ ($0<x<1$) layer 27a having an energy-band gap greater than the former. This p-type nitride semiconductor layer 27 may be formed by growing the p-type nitride semiconductor layer 27 on the substrate 21 by the MOCVD process using hydrazine-based gas as a nitrogen precursor and $N_2$ gas as a carrier gas. Such a process for growing the p-type nitride semiconductor layer 27 significantly reduces the amount of hydrogen produced. Thus, it is possible to form a p-type nitride semiconductor layer 27 in which p-type impurities are activated, without separate heat treatment. Additionally, $NH_3$ gas may be partially mixed with the hydrazine-based gas for use as a nitrogen precursor. Preferably, the amount of $NH_3$ in the mixed gas does not exceed 50% of the total.

Next, the active layer 26 was formed on the p-type $Al_xGa_{1-x}N$ ($0<x<1$) layer 27a. The active layer 26 may be made of a n-type impurity-doped GaN/InGaN layer with the multi-quantum well structure. The n-type nitride semiconductor layer 25 may include one or more layer made of n-type $Al_xIn_yGa_{1-(x+y)}N$ ($0 \leq x, y \leq 1$) material. For instance, the n-type nitride semiconductor layer 25 may be formed by growing an n-type $Al_xGa_{1-x}N$ ($0<x<1$) layer 25a on the active layer 26, followed by an n-type GaN layer 25b.

Since the sapphire substrate 21 is electrically insulative, in order to form both electrodes on an upper surface thereof, firstly, the n-type nitride semiconductor layer 25 and the active layer 26 were etched to expose some of the upper surface of the n-type nitride semiconductor layer 25. At this time, a portion of the p-type nitride semiconductor layer 27 may also be etched to form an appropriately exposed surface, together with the n-type nitride semiconductor layer 25. A p-electrode 29b was formed on the exposed surface of the p-type nitride semiconductor layer 27, while an n-electrode 29a was formed on the n-type nitride semiconductor layer 25.

Figure 1:
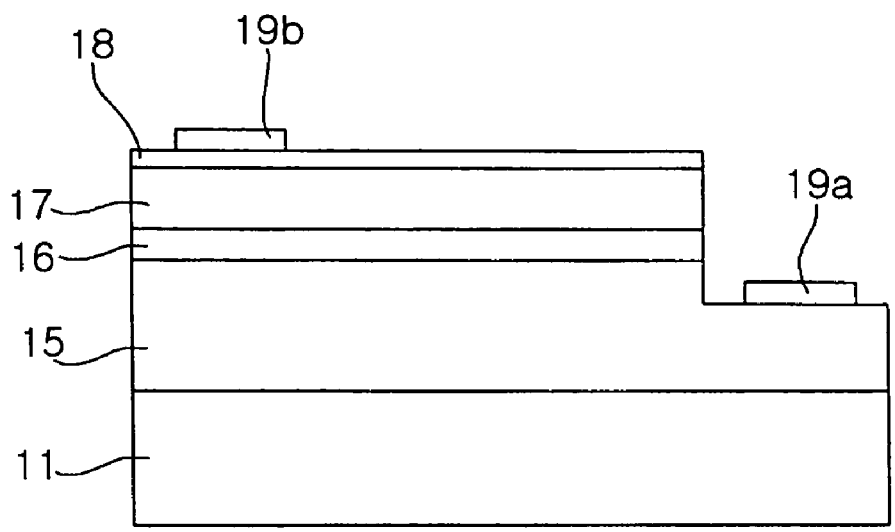
FIG. 1 is a cross-sectional side view of the conventional nitride semiconductor light-emitting device.

A conventional nitride semiconductor light-emitting device shown in FIG. 1 has a structure in which the p-type nitride semiconductor layer is disposed on an upper side, e.g. a main light-emitting region, and thus requires formation of a transparent electrode layer for electric current diffusion and light transmission. However, unlike the conventional case, the present invention may eliminate the transparent electrode. Preferably, the n-electrode 29a may be formed of a Ti/Al layer while the p-electrode 29b may be formed of a Ni/Au layer.

Although this embodiment was illustrated with reference to the sapphire substrate 21, other substrates such as SiC, ZnO, GaN, GaAs or Si substrates may be used.

Figure 3:
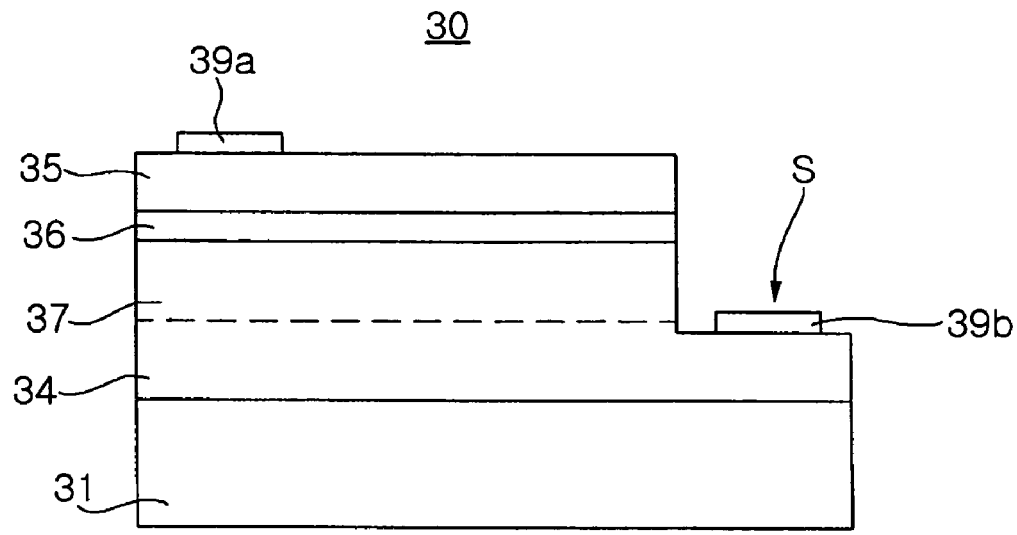
FIG. 3 is a cross-sectional side view of a nitride semiconductor light-emitting device according to another embodiment of the present invention.

FIG. 3 is a cross-sectional side view of a nitride semiconductor light-emitting device 30 according to another embodiment of the present invention.

In this embodiment, an additional p-type contact layer is provided in order to obtain a lower contact resistance between a p-electrode and a p-type nitride semiconductor layer, and an improvement of an electric current diffusion effect from the p-electrode.

As shown in FIG. 3, the nitride semiconductor light-emitting device 30 includes a sapphire substrate 31, and a p-InGaN layer 34 as a p-type contact layer formed sequentially thereon. A p-type nitride semiconductor layer 37, an active layer 36 and an n-type nitride semiconductor 35 may be sequentially formed on the p-InGaN layer 34. Also, in this embodiment, prior to forming the p-type nitride semiconductor layer 37, a buffer layer such as a low temperature nucleus-growth layer made of $Al_xIn_yGa_{1-(x+y)}N$ ($0 \leq x, y \leq 1$) material may be additionally formed.

Now, a process for producing the nitride semiconductor light-emitting device 30 will be described with reference to FIG. 3.

The p-InGaN layer 34 provided in this embodiment is a nitride semiconductor layer having a relatively lower contact resistance and thus may serve as a contact layer for the p-type nitride semiconductor layer 37. As material for the p-type contact layer 34, other crystal layers other than a nitride semiconductor layer may also be used. For example, a p-type ZnO layer is preferably used.

Next, the p-type nitride semiconductor layer 37 was formed on the p-InGaN layer 34. The p-type nitride semiconductor layer 37, as described above, may be prepared by forming the nitride semiconductor layer 37 containing p-type impurities activated without heat treatment by the MOCVD process using hydrazine-based gas as a nitrogen precursor and nitrogen gas as a carrier gas. Further, a partial mixture of hydrazine-based gas and $NH_3$ gas as a nitrogen precursor may also exhibit a similar effect. But, it is preferable that the amount of $NH_3$ gas in the above mixture does not exceed 50% of the total.

Next, the active layer 36 and n-type nitride semiconductor 35 were sequentially formed on the p-type nitride semiconductor layer 37. Similar to that shown in FIG. 2, in this embodiment, since the sapphire substrate 31 is electrically insulative, in order to form a p-electrode 39b, the n-type nitride semiconductor layer 35 and the active layer 36, and further p-type nitride semiconductor 37 were mesa etched to expose a portion of the upper surface of the p-type InGaN layer 34 used as a contact layer. The p-electrode 39b was formed on the exposed portion of the surface of the p-type InGaN layer 34 while an n-electrode 39a was formed on the n-type nitride semiconductor layer 35. Preferably, the n-electrode 39a may be formed of a Ti/Al layer, and the p-electrode 39b may be formed of a Ni/Au layer.

As can be seen from the foregoing, formation of a separate contact layer for the p-type nitride semiconductor layer 35 in accordance with this embodiment can improve the electric current diffusion from the p-electrode 39b. Therefore, it is expected that this embodiment can reduce the area (S) of the p-electrode 39b under the same conditions and in turn reduce the size of an active layer region removed by mesa etching, and thereby can sufficiently secure an effective light-emitting area of the light-emitting device.

Figure 4:
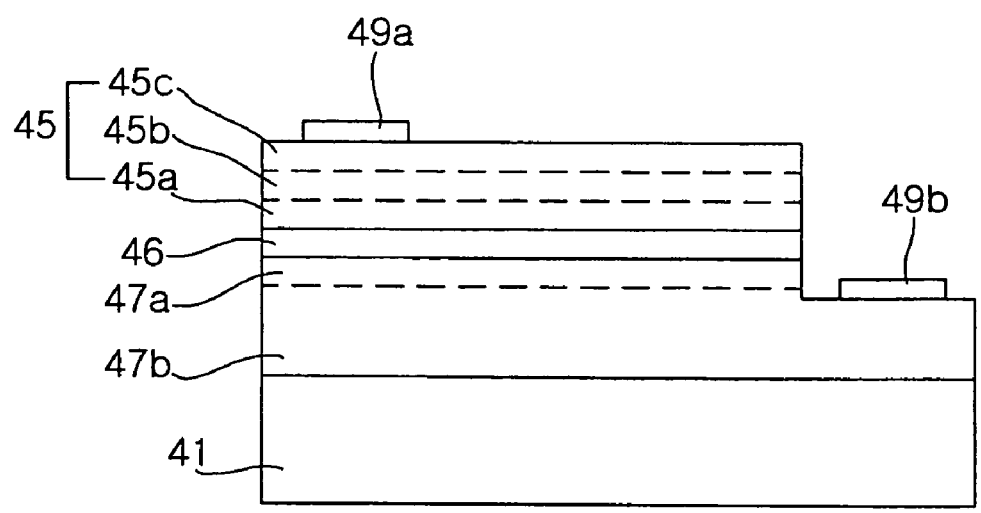
FIG. 4 is a cross-sectional side view of a nitride semiconductor light-emitting device according to yet another embodiment of the present invention.

FIG. 4 is a cross-sectional side view of a nitride semiconductor light-emitting device 40 according to another embodiment of the present invention.

In this embodiment, an additional p-type contact layer is added in order to obtain a relatively lower contact resistance between an n-electrode and an n-type nitride semiconductor layer, and improve electric current diffusion from the n-electrode.

As shown in FIG. 4, the nitride semiconductor light-emitting device 40 includes a sapphire substrate 41, and a p-type nitride semiconductor layer 47, an active layer 46 and an n-type nitride semiconductor layer 45 formed sequentially thereon. In addition, to improve a lattice matching of the p-type nitride semiconductor layer 47 with the sapphire substrate 41 a buffer layer may be formed prior to growing the p-type nitride semiconductor layer 47. As the buffer layer, a low temperature nucleus-growth layer made of $Al_xIn_yGa_{1-(x+y)}N$ ($0 \leq x, y \leq 1$) material may be used. The n-type nitride semiconductor layer 45 used in this embodiment was disposed on an upper portion connected with an n-electrode 49a and thereby contained a high concentration n-type GaN layer 45c to improve contact resistance and electric current diffusion.

Now, a process for producing a nitride semiconductor light-emitting device 40 will be described with reference to FIG. 4.

Firstly, a p-type nitride semiconductor layer 47 may include one or more layers made of p-type $Al_xIn_yGa_{1-(x+y)}N$ ($0 \leq x, y \leq 1$) material. For instance, the p-type nitride semiconductor layer 47 may be formed by forming a p-type GaN layer 47b on the substrate 41, followed by a p-type $Al_xGa_{1-x}N$ ($0<x<1$) layer 47a. This p-type nitride semiconductor layer 47 may be formed on the substrate 41 by the MOCVD process using hydrazine-based gas as a nitrogen precursor and nitrogen gas as a carrier gas. According to this process, as described above, the p-type nitride semiconductor layer 47 can be prepared, in which p-type impurities were in an activated state without a subsequent heat treatment process.

Next, the active layer 46 was formed on the p-type $Al_xGa_{1-x}N$ ($0<x<1$) layer 47a. The active layer 46 may be made of an undoped GaN/InGaN layer having a Multi-Quantum Well structure.

Then, the n-type nitride semiconductor layer 45 may include one or more layer made of n-type $Al_xIn_yGa_{1-(x+y)}N$ ($0 \leq x, y \leq 1$) material. For instance, the n-type nitride semiconductor layer 45 may be formed by sequentially growing an n-type $Al_xGa_{1-x}N$ ($0<x<1$) layer 45a, an n-type GaN layer 45b, and the high concentration n-type GaN layer 45c on the active layer 46. Additional use of the high concentration n-type GaN layer 45c lowers a contact resistance with the n-electrode 49a and greatly improves electric current diffusion, resulting in significant improvement of the electrical properties of the device. Therefore, the high concentration n-type GaN layer 45c may be anticipated to give a similar effect so long as it is a high concentration n-type nitride semiconductor layer. Therefore, the layer 45 may be made of other materials satisfying the composition formula of $Al_xIn_yGa_{1-(x+y)}N$ ($0 \leq x, y \leq 1$) as well.

Also, in this embodiment, since the sapphire substrate 41 is electrically insulative, the mesa etching for forming both of the two electrodes on the upper surface was carried out similar to embodiments of FIGS. 2 and 3. This mesa etching process selectively etches the n-type nitride semiconductor layer 45 and the active layer 46, at a predetermined region, to expose a portion of the upper surface of the n-type nitride semiconductor layer 45 corresponding to the predetermined region. At this time, some region of the p-type nitride semiconductor layer 47 may also be etched to form an appropriately exposed surface. A p-electrode 49b was formed on the exposed surface portion of the p-type nitride semiconductor layer 47 while an n-electrode 49a was formed on the n-type nitride semiconductor 45. Preferably, the n-electrode 49a may be formed of a Ti/Al layer while the p-electrode 49b may be formed of a Ni/Au layer.

Figure 5:
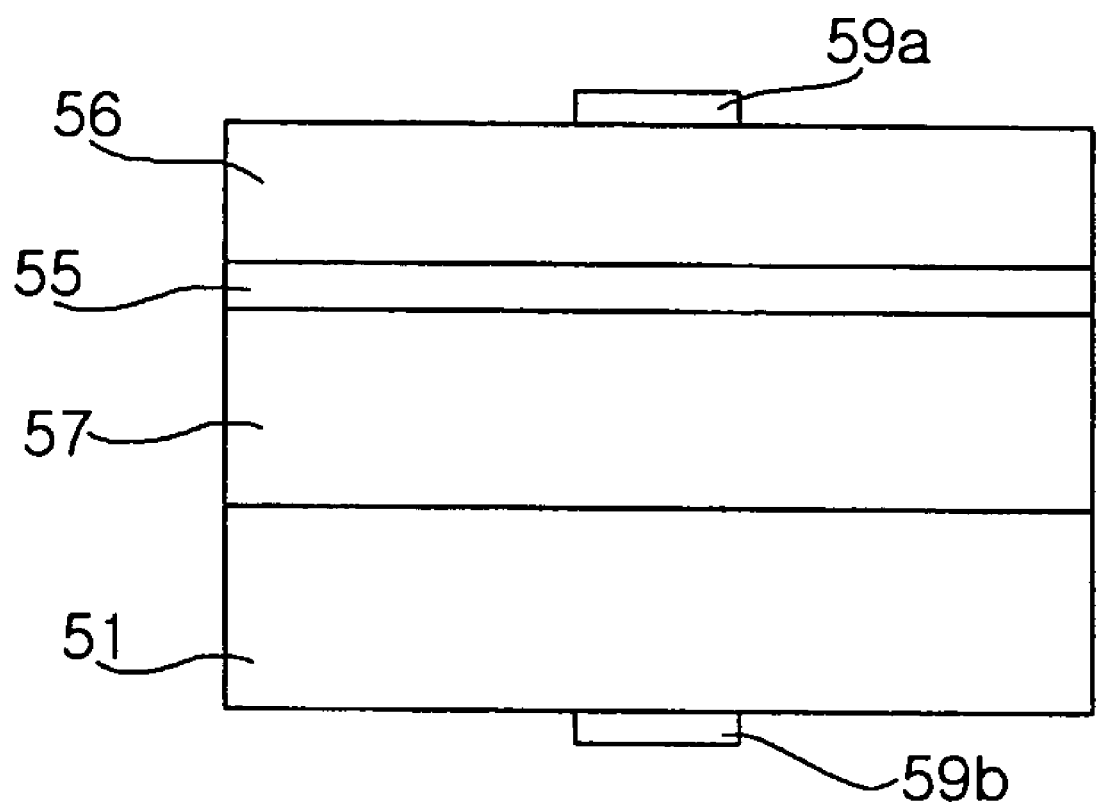
FIG. 5 is a cross-sectional side view of a nitride semiconductor light-emitting device according to yet another embodiment of the present invention.

In embodiments shown in FIG. 2 through FIG. 4, for the purpose of illustration, the sapphire substrate was used as the substrate for growing nitride semiconductor crystal. However, a SiC substrate, and further an electrically conductive p-type substrate may also be used. For example, the p-type impurities-doped GaN, Si, ZnO or GaAs substrates may be used as the p-type substrate.

Where an electrically conductive p-type substrate is employed, processes such as mesa etching, etc. may be eliminated, and there is also no decrease in effective light-emitting area due to that, thus improving light efficiency thereof. In addition, it is possible to form a vertical structure by formation of the p-electrode on the back surface of the p-type substrate and thus decrease an electric current crowding phenomenon due to flow of electrical current in the lateral direction, as seen in the conventional nitride semiconductor light-emitting device. FIG. 5 shows a cross-sectional side view of a nitride semiconductor light-emitting device having a vertical structure according to another still embodiment of the present invention.

FIG. 5 is a cross-sectional side view of a nitride semiconductor light-emitting device according to another embodiment of the present invention.

The nitride semiconductor light-emitting device 50 shown in FIG. 5 has a structure including an electrically conductive p-type substrate 51, and a p-type nitride semiconductor layer 57, an active layer 56 and an n-type nitride semiconductor layer 55 formed sequentially thereon. As the electrically conductive p-type substrate, GaN, Si, ZnO and GaAs substrates may be used. Further, the light-emitting device 50 shows a vertical structure having a p-electrode 59b and an n-electrode 59a formed on the lower surface of the p-type substrate 51 and the upper surface of the n-type nitride semiconductor 57, respectively.

Below, a process for producing the nitride semiconductor light-emitting device 50 will be described with reference to FIG. 5.

Firstly, the p-type nitride semiconductor layer 57 was formed on the p-type substrate. This p-type nitride semiconductor layer 57 was formed by the MOCVD process using hydrazine-based gas as a nitrogen precursor and nitrogen gas as a carrier gas, as described above. Preferably, prior to forming the p-type nitride semiconductor layer 57, a buffer layer such as a low temperature nucleus-growth layer made of $Al_xIn_yGa_{1-(x+y)}N$ ($0 \leq x, y \leq 1$) material may be additionally formed.

Next, the active layer 56 and the n-type nitride semiconductor layer 55 were formed sequentially on the p-type nitride semiconductor layer 57. This growing process may be continuously carried out by the MOCVD process used in the previous growing process of the p-type nitride semiconductor layer 57.

Then, each of the p- and n-electrodes 59b, 59a was formed on the lower surface of the p-type substrate 51 and the upper surface of n-type nitride semiconductor layer 57, respectively. Unlike FIG. 2 through FIG. 4, this embodiment has no step of mesa etching, and thereby no partial removal of an active region, resulting in relative increase of an effective light-emitting area leading to an improvement of light efficiency. In addition, it is possible to reduce deterioration of electrical properties and reliability due to an electric current crowding phenomenon resulting from lateral flow of an electric current in the conventional nitride semiconductor light-emitting device.

Although the present invention was described in detail with reference to the embodiments exhibiting a variety of advantages as shown in FIG. 2 through FIG. 5, it will be readily appreciated by those skilled in the art that characteristic components in respective embodiments may be separately implemented and also those in one embodiment in combination with may be implemented.

As described above, in accordance with the present invention, provided is a nitride semiconductor light-emitting device having an n-type nitride semiconductor layer disposed on a light-emitting side (generally, the side opposite the substrate) of an active layer prepared by forming a p-type nitride semiconductor layer using a process in which heat treatment for activating p-type impurities may be eliminated. As a result, the present invention overcomes the problems associated with a complex process and a decrease of light-emitting efficiency due to the conventional transparent electrode layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process of producing a nitride semiconductor light-emitting device, said process comprising the steps of:
    preparing a substrate;
    growing a p-type nitride semiconductor layer by the MOCVD (Metal Organic Chemical Vapor Deposition) process using hydrazine-based gas as a nitrogen precursor and $N_2$ gas as a carrier gas;
    forming an active layer on the p-type nitride semiconductor layer;
    forming an n-type conductive nitride semiconductor layer on the active layer; and
    forming p- and n-electrodes in electrical connection with the p- and n-type nitride semiconductor layers, respectively;
    wherein the hydrazine-based, nitrogen precursor gas used in the step of growing the p-type nitride semiconductor layer is a mixed gas additionally containing $NH_3$ gas, and the amount of the $NH_3$ gas is less than 50% of the total amount of the mixed gas.

2. The process as set forth in claim 1, wherein the dopant in the p-type nitride semiconductor layer is Mg.

3. The process as set forth in claim 1, further comprising the step of:
    forming a buffer layer on the substrate, prior to forming the p-type nitride semiconductor layer.

4. The process as set forth in claim 3, wherein the buffer layer is a low temperature nucleus-growth layer made of $Al_xIn_yGa_{1-(x+y)}N$ ($0 \leq x, y \leq 1$) material.

5. The process as set forth in claim 1, wherein the step of forming the p-type nitride semiconductor layer comprises the steps of forming a first layer made of p-type $Al_xIn_yGa_{1-(x+y)}N$ ($0 \leq x, y \leq 1$) material on the substrate, and forming a second layer made of p-type $Al_xIn_yGa_{1-(x+y)}N$ ($0 \leq x, y \leq 1$) material having an energy band gap greater than that of the first layer thereon.

6. The process as set forth in claim 1, wherein the step of forming the n-type nitride semiconductor layer comprises the steps of forming a first layer made of n-type $Al_xIn_yGa_{1-(x+y)}N$ ($0 \leq x, y \leq 1$) material on the active layer, and forming a second layer made of n-type $Al_xIn_yGa_{1-(x+y)}N$ ($0 \leq x, y \leq 1$) material having an energy band gap smaller than that of the first layer thereon.

7. The process as set forth in claim 1, wherein the step of forming the n-type nitride semiconductor layer comprises the step of additional forming of a high concentration n-type $Al_xIn_yGa_{1-(x+y)}N$ ($0 \leq x, y \leq 1$) layer on the n-type nitride semiconductor layer.

8. The process as set forth in claim 1, wherein the substrate is an electrically insulative material, and the step of forming the p- and n-electrodes comprises the steps of mesa etching the n-type nitride semiconductor layer and active layer to partially remove a portion thereof so as to expose a region of the p-type nitride semiconductor layer, and forming the p- and n-electrodes on the exposed portion of the p-type nitride semiconductor layer and the n-type nitride semiconductor layer, respectively.

9. The process as set forth in claim 8, wherein the substrate is selected from the group consisting of sapphire, SiC, ZnO, GaN, GaAs and Si substrates.

10. The process as set forth in claim 8, wherein the p-electrode includes a Ni/Au layer and the n-electrode includes Ti/Al layer.

11. The process as set forth in claim 1, further comprising the step of:
    forming a p-type contact layer on the substrate, prior to forming the p-type nitride semiconductor layer;
    wherein the substrate is an electrically insulative material, and the step of forming the p- and n-electrodes comprises the steps of mesa etching the n-type nitride semiconductor layer and active layer to partially remove a portion thereof so as to expose a region of the p-type nitride semiconductor layer, and forming the p- and n-electrodes on the exposed portion of the p-type nitride semiconductor layer and the n-type nitride semiconductor layer, respectively.

12. The process as set forth in claim 11, wherein the p-type contact layer is a p-type ZnO layer or p-type InGaN layer.

13. The process as set forth in claim 1, wherein the substrate is a p-type conductive substrate, and the step of forming the p- and n-electrodes comprises the steps of forming the p-electrode on the lower part of the p-type conductive substrate, and forming the n-electrode on the n-type nitride semiconductor layer.

14. The process as set forth in claim 13, wherein the substrate is selected from the group consisting of p-type impurities-doped SiC, ZnO, GaN, GaAs and Si substrates.

15. A nitride semiconductor light-emitting device prepared according to the process as set forth in claim 1.

16. A process of producing a nitride semiconductor light-emitting device, said process comprising the steps of:
    preparing an electrically insulative substrate;
    forming a p-type contact layer on the substrate;
    growing a p-type nitride semiconductor layer on the p-type contact layer by MOCVD process using hydrazine-based gas as a nitrogen precursor and N2 gas as a carrier gas;
    forming an active layer on the p-type nitride semiconductor layer;
    forming an n-type conductive nitride semiconductor layer on the active layer;
    mesa etching the n-type nitride semiconductor layer, the active layer and the p-type nitride semiconductor layer to partially remove a portion of them so as to expose a region of the p-type contact layer; and
    forming the p- and n-electrodes on the exposed portion of the p-type contact layer and the n-type nitride semiconductor layer, respectively,
    wherein the p-type contact layer is a p-type ZnO layer.

17. The process as set forth in claim 13, wherein the substrate is selected from the group consisting of p-type impurities-doped ZnO, GaN, and GaAs substrates.

18. The process as set forth in claim 13, further comprising the step of:
    forming a buffer layer on the substrate, prior to forming the p-type nitride semiconductor layer, the buffer layer is a low temperature nucleus-growth layer made of $Al_xIn_yGa_{1-(x+y)}N$ ($0 \leq x, y \leq 1$) material.

* * * * *